(12) United States Patent
Masuta et al.

(10) Patent No.: US 6,445,721 B1
(45) Date of Patent: Sep. 3, 2002

(54) LASER DIODE LIGHT EMISSION SENSING CIRCUIT

(75) Inventors: Tomoaki Masuta, Tokyo; Yasuhiro Ootuka, Miyagi, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,949

(22) Filed: Dec. 27, 1999

(30) Foreign Application Priority Data

Jan. 13, 1999 (JP) ............................................ 11-007005

(51) Int. Cl.[7] .............................. H01S 3/00; H01S 3/10
(52) U.S. Cl. ............... 372/38.01; 372/29.011; 372/29.012; 372/38.1; 372/38.07
(58) Field of Search ....................... 372/43, 38.1, 38.01, 372/29.011, 29.012, 38.07

(56) References Cited

U.S. PATENT DOCUMENTS

| | | | | |
|---|---|---|---|---|
| 5,062,114 A | * | 10/1991 | Ito | 372/31 |
| 5,754,577 A | * | 5/1998 | Casper et al. | 372/38.07 |
| 5,781,572 A | * | 7/1998 | Tahara et al. | 372/34 |
| 5,986,687 A | * | 11/1999 | Hori | 347/246 |
| 6,229,833 B1 | * | 5/2001 | Noda et al. | 372/38.09 |
| 6,292,284 B1 | * | 9/2001 | Takauji et al. | 359/187 |

FOREIGN PATENT DOCUMENTS

JP 04-010677 1/1992

* cited by examiner

*Primary Examiner*—Paul Ip
*Assistant Examiner*—James Menefee
(74) *Attorney, Agent, or Firm*—McGinn & Gibb,PLLC

(57) ABSTRACT

A laser diode light emission sensing circuit comprises a photodiode 3 which senses a lightwave signal of a laser diode to convert it into a current signal, an I/V converting circuit 4 which converts the current signal from the photodiode 3 into a voltage signal, a comparator 6 which compares the voltage signal from the I/V converting circuit 4 with a reference voltage of a reference voltage source 5 to output a prescribed signal when the voltage signal from the I/V converting circuit 4 exceeds the reference voltage from the reference voltage source 5, the reference voltage source 5 which outputs the reference voltage to comparator 6, an inverter 9 which inverts an output of a CELL signal, and DFF circuit 7 which utilizes the output of the comparator 6 as a clock input, while utilizes an output of the inverter 9 as a reset input, and maintains always the data input at a high level, whereby a luminous state of the laser diode can be maintained digitally. As a result, maintenance of the luminous state of the laser diode as well as cancellation of the maintenance thereof can be digitally processed, whereby it becomes possible to effect such processing at high-speed.

12 Claims, 7 Drawing Sheets

LASER DIODE LIGHT EMISSION SENSING CIRCUIT

FIELD OF THE INVENTION

The present invention relates to a laser diode light emission sensing circuit.

BACKGROUND OF THE INVENTION

FIG. 1 shows a constitution of a conventional laser diode light emission sensing circuit. The conventional laser diode light emission sensing circuit shown in FIG. 1 comprises a laser diode 20, a photodiode 22 for sensing a luminous state of the laser diode 20, a current/voltage converting circuit (hereinafter referred to as "I/V converting circuit) 23, a reference voltage source 24 for producing a reference voltage, a comparator 25 for comparing a voltage signal from the I/V converting circuit 23 with the reference voltage from the reference voltage source 24, a time constant circuit 26, and an output terminal 32. Furthermore, the time constant circuit 26 comprises a transistor 27, a resistance 28, a capacitor 29, and a comparator 31, and a reference voltage source 30.

The laser diode light emission sensing circuit having the above described constitution functions to sense a luminous state of the laser diode 20 such that a lightwave signal of the laser diode 20 is received by the photodiode 22, a current signal output of the photodiode 22, is converted into a voltage signal by means of the I/V converting circuit 23, the voltage signal converted is compared with a reference voltage from the reference voltage source 24 in the comparator 25, and further a logical output of the output terminal 32 is maintained by the use of the time constant circuit 26. The time constant circuit 26 is required to maintain an output after detecting the output of the laser diode 20 even if logic 0 continues for a certain period of time in the laser diode 20.

However, since the above-mentioned laser diode light emission sensing circuit maintains a logical output of the output terminal by employing the time constant circuit, there is a problem of realizing downsizing of apparatus.

Since time constant circuit maintains an output in an analog fashion, it is necessary for a capacitor having a high capacity. Such capacitor requires a capacitive value of 100 pF or high in order that logic 0 maintains at 72 bits or more in a signal having a bit rate of 150 Mbps, so that a size of chip becomes bulky.

Moreover, a length of burst signal produced in synchronous with a light emitting timing or a light outing timing in a laser diode is generally about 2.5 μsec., a guard period of time between the burst signals is 26 nsec., and a discharge time constant of the above-mentioned time constant circuit is about 1.5 μsec. As shown in FIG. 2, when a laser diode does not emit light because of a trouble which happens in process of burst signals, such trouble cannot be detected up to a point in the middle of the burst signals from discharge time constant.

SUMMARY OF THE INVENTION

The present invention has been made in view of the above-mentioned problems involved in the prior art. Accordingly, an object of the present invention is to provide a laser diode light emission sensing circuit which can reduce a size of the resulting apparatus, and can shorten a period of time required for detecting a trouble in the laser diode.

According to the first feature of the invention, a laser diode light emission sensing circuit for sensing a luminous state of the laser diode, comprises:

a burst signal producing means for producing a burst signal which changes to a first state in synchronous with light emitting timing of the laser diode, while which changes to a second state in synchronous with light outing timing of the laser diode; and a maintaining means which maintains a prescribed output state representing a luminous state of the laser diode in synchronous with changing to a first state of the burst signal in a term of a third state of a CELL signal which changes to the third state before starting a light emission term wherein the laser diode repeats continually light emission and light outing, and which changes from termination of the light emission term to a fourth state, the maintaining means cancelling the prescribed output state maintained in synchronous with changing to the fourth state of the CELL signal.

In the above described laser diode light emission sensing circuit, the maintaining means may be a delay flip-flop which utilizes the burst signal from the burst signal producing means as a clock input, while which utilizes the CELL signal as a reset input, and maintains a data input always at a high level.

In the above described laser diode light emission sensing circuit, the maintaining means may contain an NOR circuit which utilizes the burst signal and the CELL signal as inputs, and a set-reset flip-flop which utilizes the output from the NOR circuit as a set input, while which utilizes the CELL signal as a reset input.

According to the second feature of the invention, a laser diode light emission sensing circuit for sensing a luminous state of the laser diode, comprises:

a light sensing means for sensing a lightwave signal of the laser diode to convert it into a current signal, a current/voltage converting means for converting a current signal from the light sensing means into a voltage signal, a comparing means for comparing a voltage signal from the current/voltage converting means with a reference voltage from a reference voltage producing means to output a predetermined signal when the voltage signal from the current/voltage converting means exceeds the reference voltage from the reference volt age producing means, the reference voltage producing means for outputting the reference voltage to the comparing means, a first output inverting means for inverting an output of a CELL signal rising before starting a light emission term wherein the laser diode repeats continually light emission and light outing, and falling from termination of the light emission term, and a delay flip-flop which utilizes an output of the comparing means as a clock input, while which utilizes an output of the first output inverting means as a reset input, and maintains .a data input always at a high level.

According to the third feature of the invention, a laser diode light emission sensing circuit for sensing a luminous state of the laser diode, comprises:

a light sensing means for sensing a lightwave signal of the laser diode to convert it into a current signal, a current/voltage converting means for converting a current signal from the light sensing means into a voltage signal, a comparing means for comparing a voltage signal from the current/voltage converting means with a reference voltage from a reference voltage producing means to output a predetermined signal when the voltage signal from the current/voltage converting means exceeds the reference voltage from the reference voltage producing means, the reference voltage producing means for outputting the reference voltage to the comparing means, and a delay flip-flop which utilizes a CELL signal falling before starting a light emission term wherein the laser diode repeats continually light emission and light outing, and rising from termination of the light emission term, as a reset input, while which utilizes an output of the comparing means as a clock input, and maintains a data input always at a high levels.

According to the fourth feature of the invention, a laser diode light emission sensing circuit for sensing a luminous state of the laser diode, comprises:

a light sensing means for sensing a lightwave signal of the laser diode to convert it into a current signal,;

a current/voltage converting means for converting a current signal from the light sensing means into a voltage signal, a comparing means for comparing a voltage signal from the current/voltage converting means with a reference voltage from a reference voltage producing means to output a predetermined signal when the voltage signal from the current/voltage converting means exceeds the reference voltage from the reference voltage producing means, the reference voltage producing means for outputting a reference voltage to the comparing means, a second output inverting means for inverting an output of a CELL signal rising before starting a light emission term wherein the laser diode repeats continually light emission and light outing, and falling from termination of the light emission term, a third output inverting means for inverting an output of the predetermined signal from the comparing means, an NOR circuit utilizing a signal from the second output inverting means and a signal from the third output inverting means as inputs to output a predetermined signal when both the signals are at a low level, and a set-reset flip-flop utilizing an output of the NOR circuit as a set input and utilizing a signal from the second output inverting means as a reset input.

According to the fifth feature of the invention, a laser diode light emission sensing circuit for sensing a luminous state of the laser diode, comprises:

a light sensing means for sensing a lightwave signal of the laser diode to convert it into a current signal, a current/voltage converting means for converting a current signal from the light sensing means into a voltage signal, a comparing means for comparing a voltage signal from the current/voltage converting means with a reference voltage from a reference voltage producing means to output a predetermined signal when the voltage signal from the current/voltage converting means exceeds the reference voltage from the reference voltage producing means, the reference voltage producing means for outputting the reference voltage to the comparing means, a third output inverting means for inverting an output of the predetermined signal from the comparing means, an NOR circuit utilizing a CELL signal falling before starting a light emission term wherein the laser diode repeats continually light emission and light outing and rising from termination of the light emission term as well as a signal from the" third output inverting means as inputs to output a predetermined signal when both the signals are at a low level, and a set-reset flip-flop utilizing an output of the NOR circuit as a set input and utilizing the CELL signal as a reset input.

BRIEF DESCRIPTION OF THE DRAWINGS

The present invention will be explained in more detail in conjunction with appended drawings, wherein.

DESCRIPTION OF THE PREFERRED EMBODIMENTS

In the following, preferred embodiments of a laser diode light emission detection circuit according to the present invention will be described in detail in conjunction with the accompanying drawings. Referring to FIGS. 3 through 7, preferred embodiments of a laser diode light emission detection circuit according to the present invention are illustrated.

Figure 1:
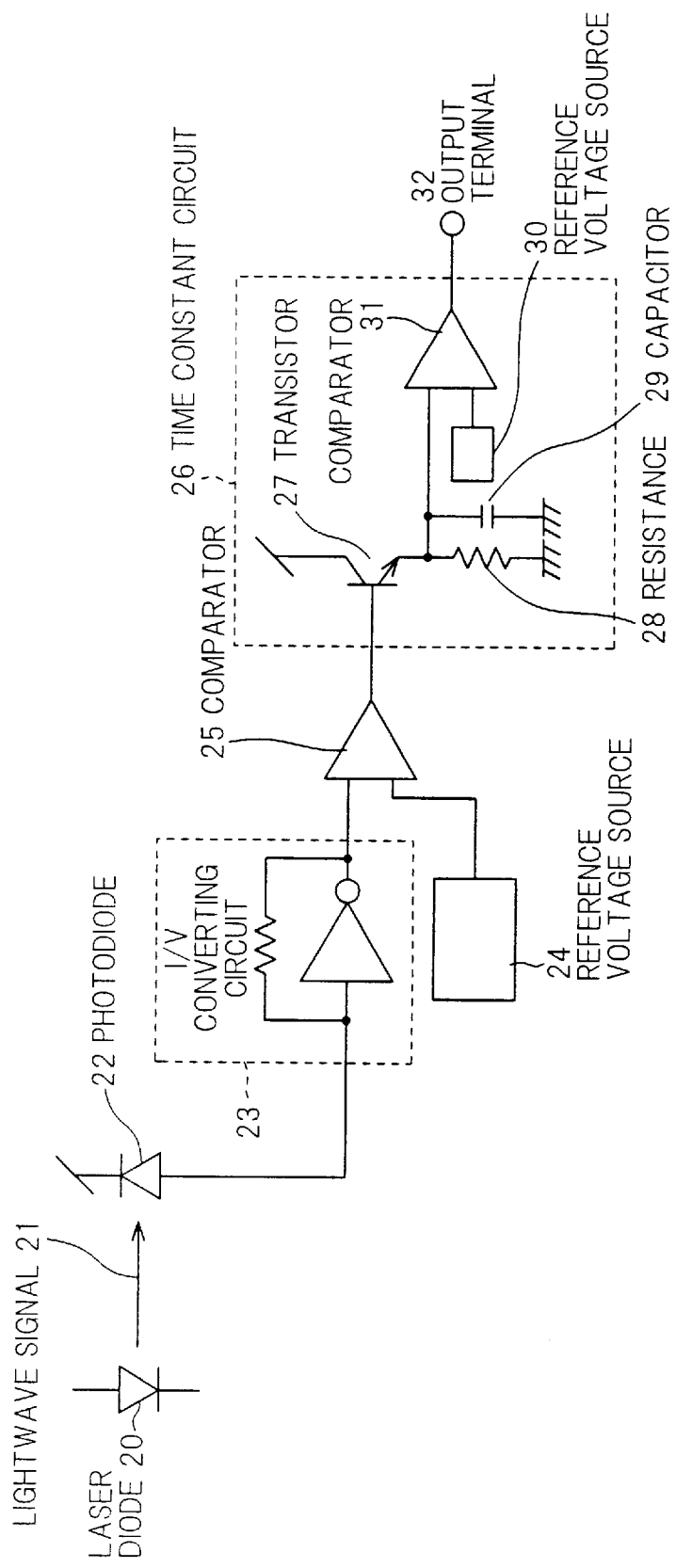
FIG. 1 is a block diagram showing a constitution of a conventional laser diode light emission detection circuit.
Figure 2:
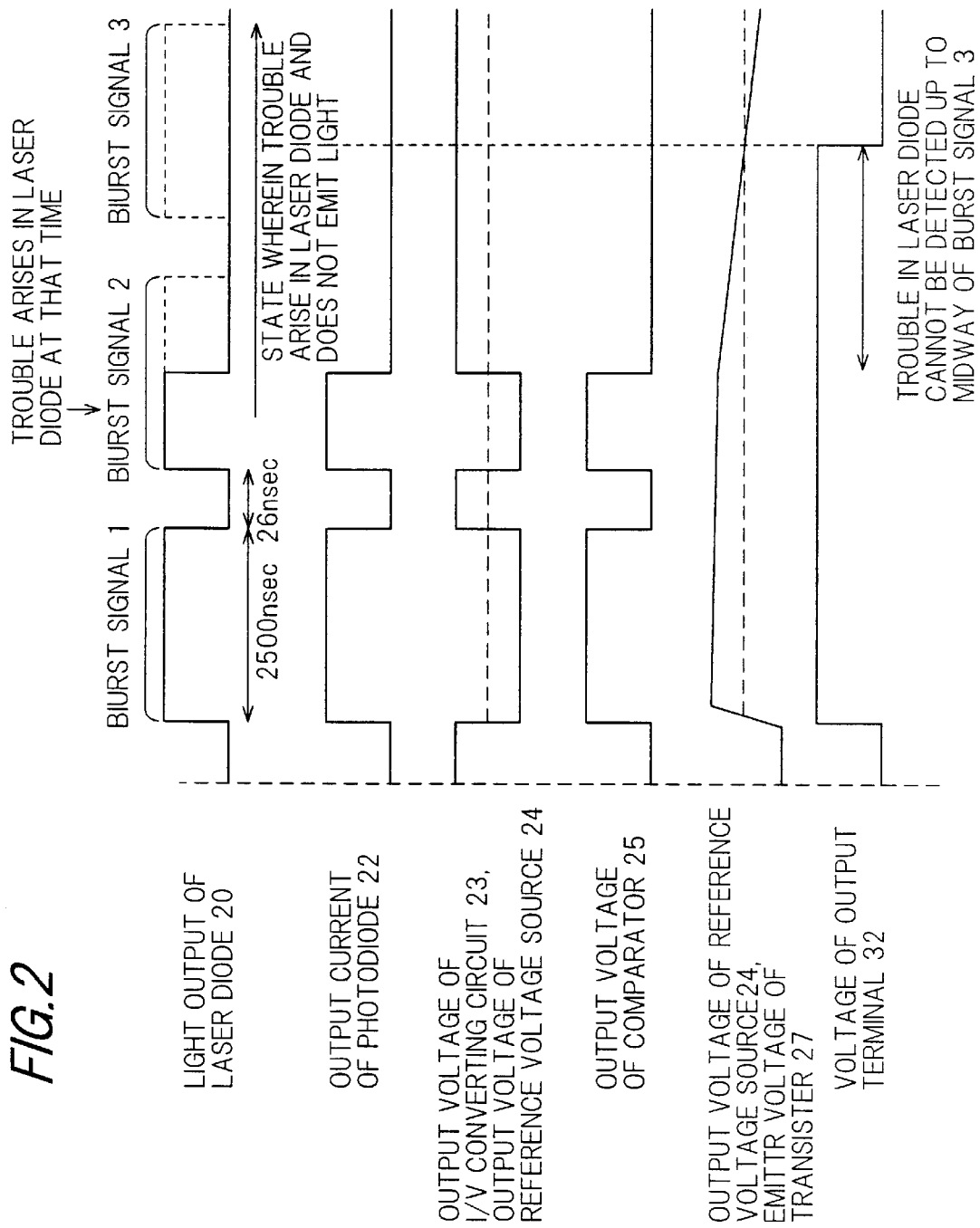
FIG. 2 is a diagram illustrating signal waveforms of a conventional laser diode light emission detection circuit.
Figure 3:
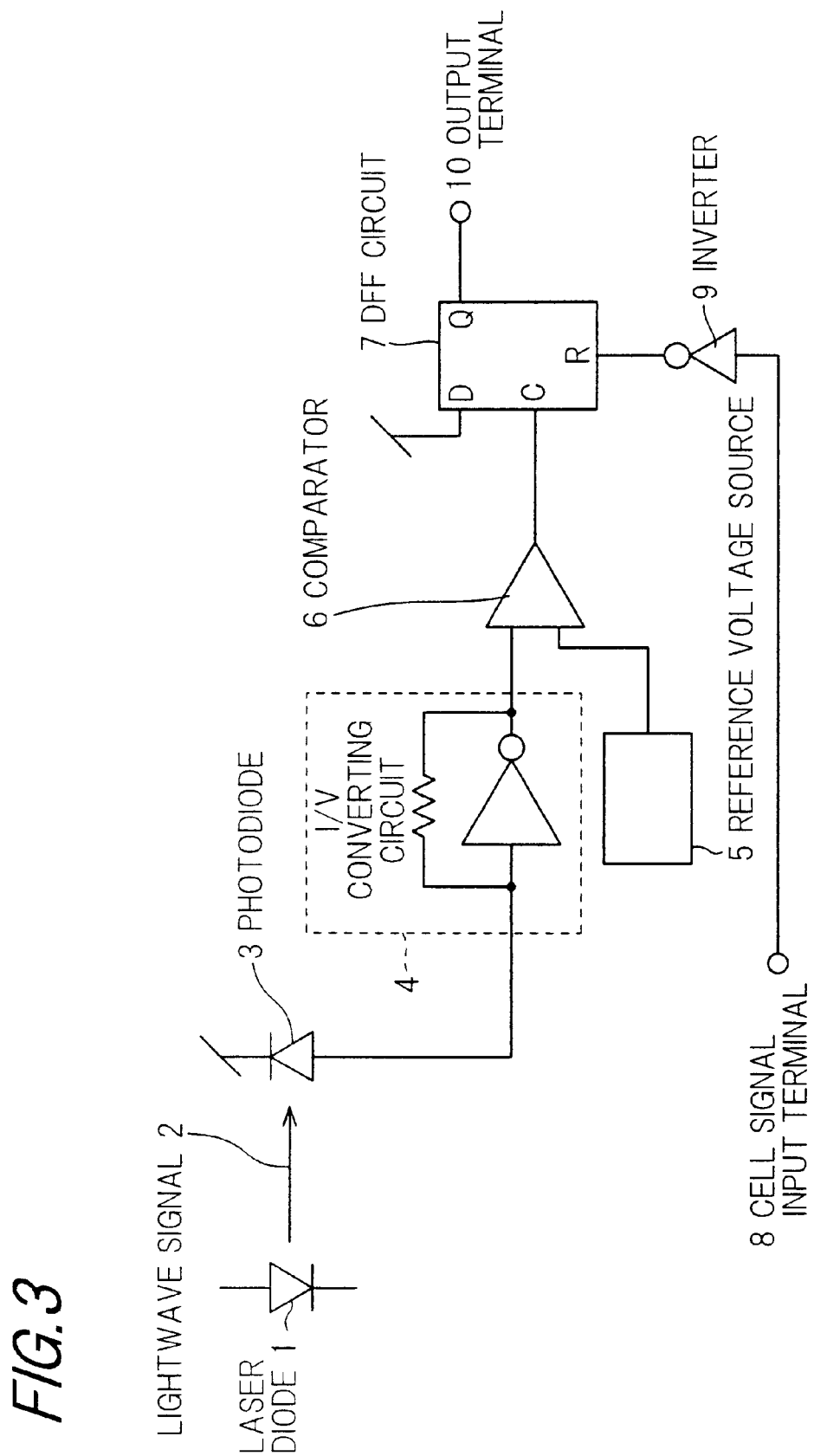
FIG. 3 is block diagram showing a constitution of a first preferred embodiment of a laser diode light emission detection circuit according to the present invention.

A constitution of a first preferred embodiment of a laser diode light emission detection circuit according to the invention is shown in FIG. 3. As shown in FIG. 3, the laser diode light emission detection circuit of the invention comprises a photodiode 3 which receives a lightwave signal 2 of a laser diode 1 to convert it into a current signal, an I/V converting circuit 4 which converts the current signal of the photodiode 3 into a voltage signal, a comparator 6 which compares the voltage signal output from the I/V converting circuit 4 with a reference voltage of la reference voltage source 5, a DFF (Delay Flip-Flop) circuit 7 which utilizes the output of the comparator 6 as a clock input and maintains always the data input at a high level, and an inverter 9 which uses a CELL signal input terminal 8 as an input terminal and outputs the data input to a reset input of the DFF circuit 7. In this case, maintenance of a luminous state of the laser diode as well as cancellation of the maintenance thereof are conducted by the DFF circuit 7 and the inverter 9.

The present preferred embodiment having the constitution as described above maintains digitally an output of a laser diode by the use of the DFF circuit 7 in order to deal with a case where the laser diode does not emit light for a certain period of time due to troubles and the like thereof after detection of the output of the laser diode in a light emission term wherein the laser diode repeats continually light emission and light outing. Furthermore, the present preferred embodiment is characterized by cancelling an output maintained by a CELL signal.

A light emission term wherein the laser diode 1 repeats continually light emission and light outing is known. In this respect, the CELL signal notifies the DFF circuit 7 of such light emission term in the first preferred embodiment. Accordingly, even if such a problem that the laser diode 1 does not emit light for a certain period of time in the light emission term and the like problem occur, the DFF circuit 7 maintains a predetermined output state representing a luminous state of the laser diode so far as the CELL signal is in a condition where such light emission term is indicated.

In the first preferred embodiment, the CELL signal rises before starting a light emission term of the laser diode and falls from termination of the light emission term of the laser diode. Moreover, a period of time from rising of the CELL signal to starting of light emission by the laser diode and a period of time from termination of the light emission term in the laser diode to falling of the CELL signal are determined respectively.

Operations of the above-mentioned laser diode light emission detection circuit will be described hereinafter by referring to signal waveforms shown in FIG. 4.

Figure 4:
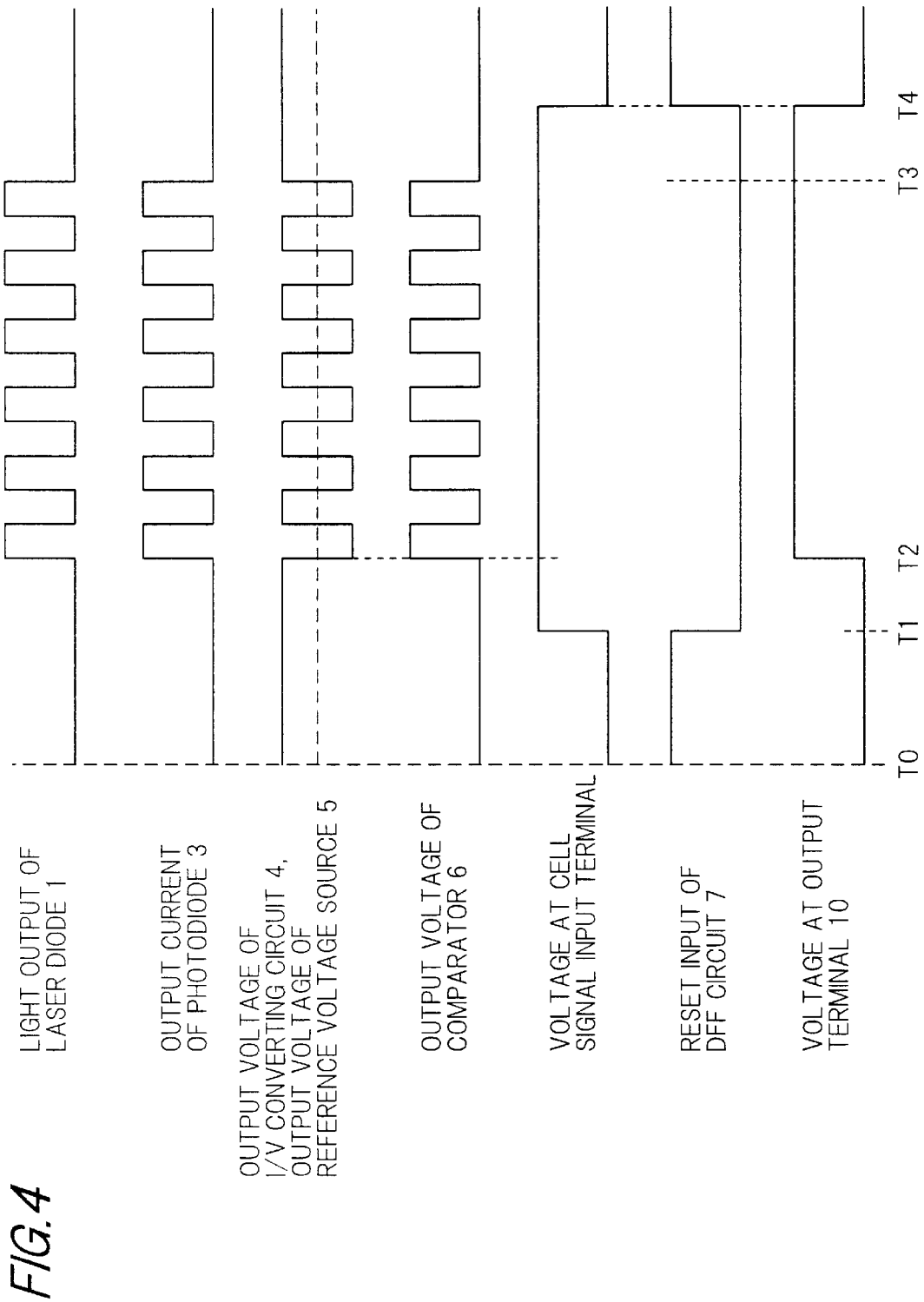
FIG. 4 is a diagram illustrating signal waveforms in the first preferred embodiment.

As shown in FIG. 4, when a voltage at the CELL signal input terminal 8 is in an L level at time T0, the DFF circuit 7 is reset so that the output terminal 10 is forcibly made to be the L level, and this means that the laser diode 1 is in unluminous condition.

At time T1, when a voltage at the CELL signal input terminal 8 changes from an L level to an H level, resetting of the DFF circuit 7 is cancelled. In this case, however, an output at the output terminal 10 does not change from the L level, because an output of the laser diode 1 is in the L level.

At time T2, when an output voltage of the I/V converting circuit 4 is lower than a reference voltage from the reference voltage source 5 and an output of the laser diode 1 becomes an H level, an output of the comparator 6 becomes the H level. Since the output of the comparator 6 is input to a clock of the DFF circuit 7, the output of the DFF circuit 7 changes to the H level at the time T2. Before a voltage at the CELL signal input terminal 8 becomes an L level and the DFF circuit is reset, an output at the output terminal 10 does not change at an H level as it is, so that even if logic 0 continues in an output of the laser diode 1, an output condition of the laser diode can be maintained.

At time T3, the lightwave signal 2 from the laser diode 1 is finished, and thereafter, when a voltage at the CEll signal input terminal 8 changes from an H level to an L level, an output of the DFF circuit 7 is reset, and the output terminal 10 comes to be logic of L level which means that the laser diode 1 is in unluminous state.

In the above-mentioned first preferred embodiment, since logic in a luminous state of a laser diode sensed is maintained digitally without employing a time constant circuit, a capacitor of a high capacity is not required. Accordingly, a chip size of LSI can be reduced. In addition, since no time constant circuit is used, there is no need of discharging a high capacity of a capacitor, so that it is sufficient for maintaining a luminous state of a laser diode and cancelling such maintenance of the luminous state by only the use of a digital circuit, hence high-speed processing becomes possible, and as a result, high-speed detection of troubles becomes possible.

It is to be noted that since it has been set out in such that the CELL signal rises before starting a light emission term of the laser diode and falls from termination of the light emission term of the laser diode in the aforementioned first preferred embodiment, the inverter 9 is provided to input a signal having an opposite phase to that of the CELL signal to the reset terminal of the DFF circuit.

Figure 5:
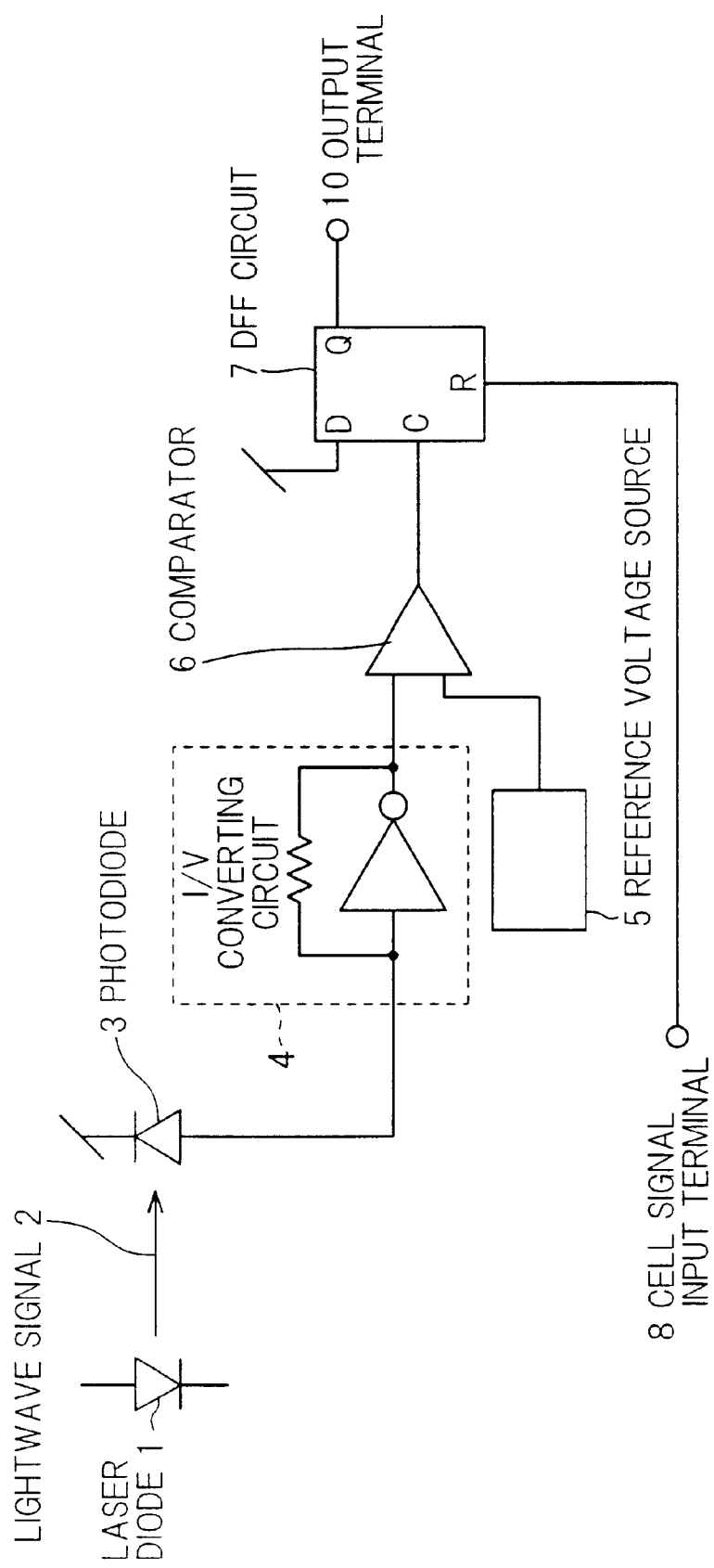
FIG. 5 is block,diagram showing a constitution of a second preferred embodiment of a laser diode light emission detection circuit according to the present invention.

In this respect, a modified example of the first preferred embodiment may be constituted in such that a CELL signal falls before starting a light emission term of the laser diode and rises from termination of the light emission term of the laser diode. According to such a modified arrangement, a DFF circuit 7 can be reset without providing the inverter 9 as shown in FIG. 5.

Next, a second preferred embodiment of a laser diode light emission detection circuit according to the present invention will be described by referring to FIG. 6.

Figure 6:
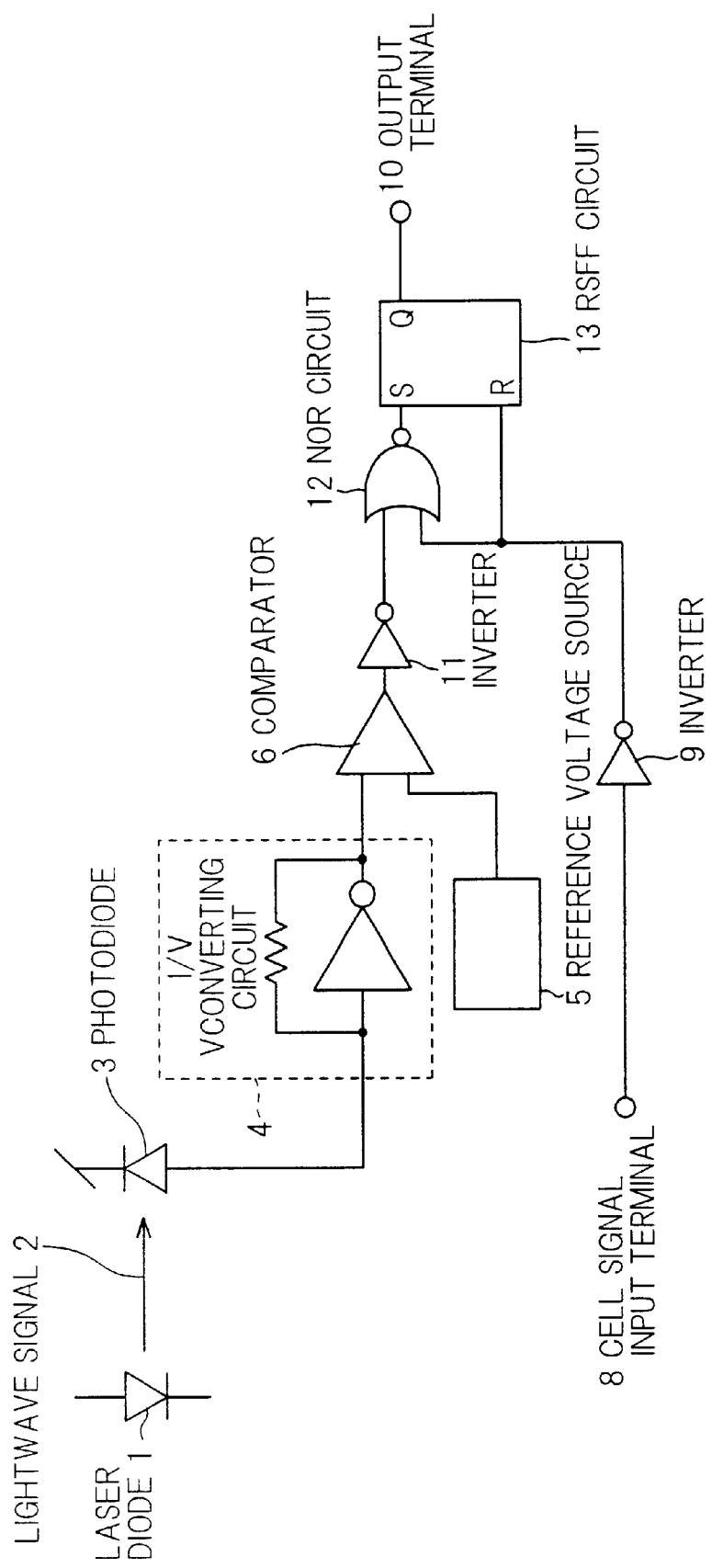
FIG. 6 is a block diagram showing a constitution of a modified example of the second preferred embodiment.

The laser diode light emission detection circuit of the second preferred embodiment shown in FIG. 6 comprises an inverter 11 for inverting an output of a signal from a comparator 6 in place of the DFF circuit 7, an NOR circuit 12 which utilizes an output signal of the inverter 11 and an output signal of the inverter 9 for inverting an output of a CELL signal as an input, and an RSFF (Reset-Set Flip-Flop) circuit 13 which utilizes an output signal of the NOR circuit 12 as a set input, while utilize the output signal of the inverter 9 as a reset input.

In the second preferred embodiment shown in FIG. 6, a maintaining circuit is composed of the RSFF circuit 13, the inverter 11, and the NOR circuit 12. As a result of employing the inverter 11 and the NOR circuit 12, logic in the CELL signal input terminal 8 has higher priority than that of the output of the comparator 9 in the RSFF circuit 13.

In also the second preferred embodiment, a CELL signal rises before starting a light emission term of the diode and falls from termination of the light emission term of the laser diode. Furthermore, a period of time after the CELL signal falls and before starting light emission of the laser diode as well as a period of time after terminating a light emission term of t he laser diode and before the CELL signal falls are determined respectively.

In the laser diode light emission detection circuit of the second preferred embodiment shown in FIG. 6, when a voltage at the CELL signal input terminal 8 is in an L level, the RSFF circuit 13 is reset, so that the output terminal 10 is forcibly made to be the L level. When a voltage at the CELL signal input terminal 8 changes from the L level to an H level, resetting of the RSFF circuit 13 is cancelled. In this case, an output of the output terminal 10 does not change so that the output thereof is in the L level as it is. Under the circumstances, when an output of the comparator 6 becomes an H level, an output of the RSFF circuit 13 comes to be a setting condition, so that it changes to the H level and such condition is maintained. Thus, even if 0 continues in logic of an input of a photodiode 3, an output at the output terminal 10 does not change as it is in the H level. When a voltage at the CELL signal input terminal 8 changes from an H level to an L level, an output of the RSFF circuit 13 is reset, the output terminal 10 returns to the L level, and maintains its condition.

In also the aforementioned second preferred embodiment, since the logic in a luminous state of the laser diode detected is digitally maintained without employing a time constant circuit, a capacitor of a high capacity becomes not required. Accordingly, a chip size of LSI can be reduced. In addition, since no time constant circuit is used, there is no need of discharging a high capacity of a capacitor, so that it is sufficient for maintaining a luminous state of a laser diode and cancelling such maintenance of the luminous state by only the use of a digital circuit, hence high-speed processing becomes possible, and as a result, high-speed detection of troubles becomes possible.

Figure 7:
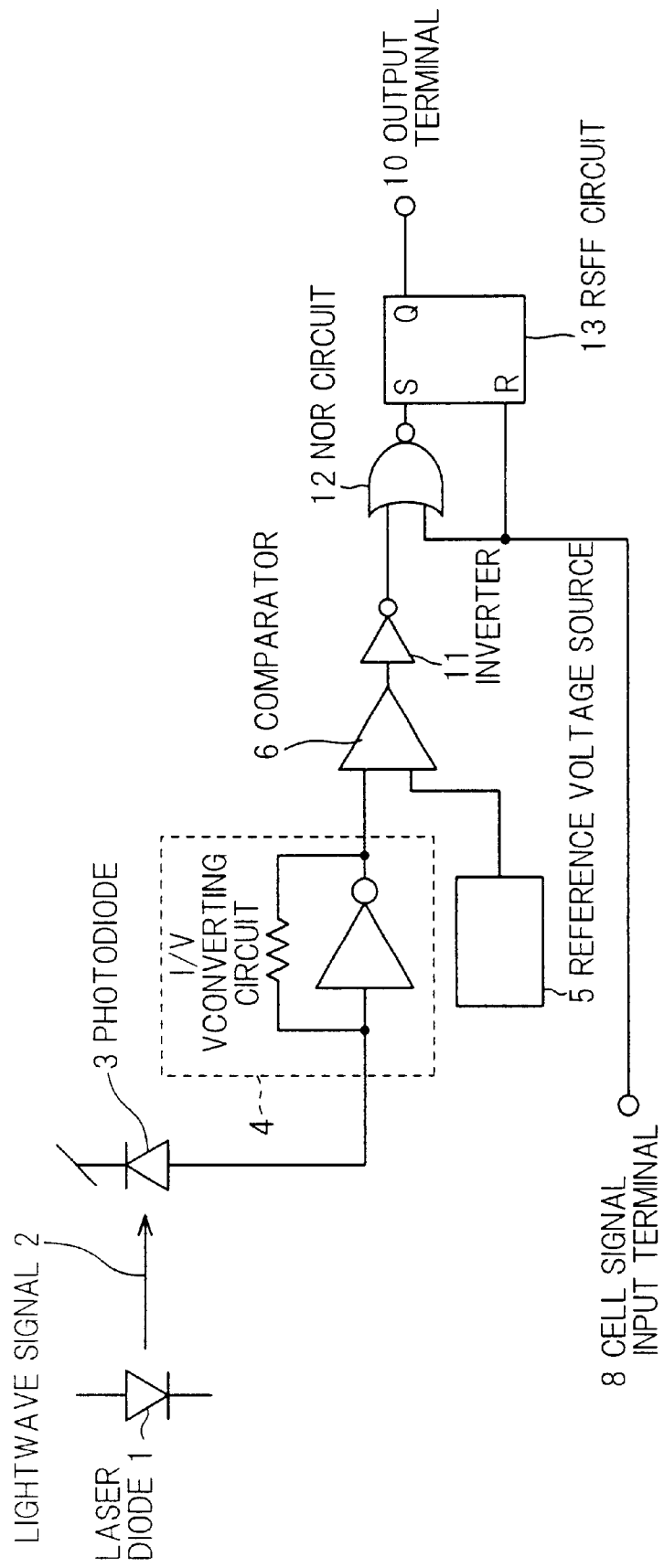
FIG. 7 is a block diagram of a modified example of the second embodiment.

In this respect, a modified example of the second preferred embodiment may be constituted in such that a CELL signal falls before starting a light emission term of the laser diode and rises from termination of the light emission term of the laser diode. According to such a modified arrangement, an RSFF circuit 13 can be reset without providing the inverter 9 as shown in FIG. 7.

Moreover, the comparator 6 outputs a signal changing to a high level in the case when a voltage signal from the I/V converting circuit 4 exceeds a reference voltage, but it may be the one which outputs a signal falling to a low level. In this case, it is not required to provide the inverter 11.

As is apparent from the above description, a laser diode light emission sensing circuit for sensing a luminous state of the laser diode comprises a maintaining means which maintains a prescribed output state representing a luminous state of the laser diode in synchronous with changing to a first state of a burst signal in a term of a third state of a CELL signal which changers to the third state before starting a light emission term wherein the laser diode repeats continually light emission and light outing, while which changes from termination of the light emission term to a fourth state, the maintaining means cancelling the prescribed output state maintained in synchronous with changing to the fourth state of the CELL signal, whereby the output can be maintained even if a luminous state of the laser diode becomes unstable in the light emission term.

Furthermore, when the maintaining means is a delay flip-flop which utilizes the burst signal as a clock input, while which utilizes the CELL signal as a reset input, and maintains a data input always at a high level, logic in a luminous state of a laser diode sensed can be maintained digitally. As a result, a time constant circuit wherein a capacitor of a high capacity for maintaining the logic in a luminous state of the laser diode has been used becomes not required, so that a chip size of LSI can be reduced. In addition, since it becomes sufficient for maintaining a luminous state of a laser diode and cancelling such maintenance of the luminous state by only the use of a digital circuit, high-speed processing becomes possible, and accordingly, a time required for detecting troubles in the laser diode can be reduced.

When the maintaining means contains an NOR circuit which utilizes the burst signal and the CELL signal as inputs, and a set-reset flip-flop which utilizes the output from the NOR circuit as a set input and utilizes the CELL signal as a reset input, logic in a luminous state of a laser diode sensed can be maintained digitally. As a result, a time constant circuit wherein a capacitor of a high capacity for maintaining the logic in a luminous state of the laser diode has been used becomes not required, so that a chip size of LSI can be reduced. In addition, since it becomes sufficient for maintaining a luminous state of a laser diode and cancelling such maintenance of the luminous state by only the use of a digital circuit, high-speed processing becomes possible, and accordingly, a time required for detecting troubles in the laser diode can be reduced.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive.

The scope of the invention is indicated by the appended claims rather than the foregoing description, and all changes that come within the meaning and range of equivalents thereof are intended to be embraced therein.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A laser diode light emission sensing circuit for sensing a luminous state of the laser diode, comprising:
    a burst signal producer for producing a burst signal which changes to a first state synchronously with light emitting timing of said laser diode, and which changes to a second state synchronously with a light outing timing of said laser diode; and
    a maintaining device which maintains a prescribed output state representing a luminous state of said laser diode in synchronous with changing to a first state of said burst signal in a term of a third state of a CELL signal which changes to said third state before starting a light emission term, wherein said laser diode repeats continually light emission and light outing, and which changes with a termination of said light emission term to a fourth state, the maintaining device canceling said prescribed output state maintained synchronously with changing to the fourth state of said CELL signal.

2. The laser diode light emission sensing circuit as claimed in claim 1, wherein:
    said maintaining device comprises a delay flip-flop which utilizes said burst signal from said burst signal producer as a clock input, and which utilizes said CELL signal as a reset input, and maintains a data input at a high level.

3. The laser diode light emission sensing circuit as claimed in claim 1, wherein:
    said maintaining device comprises a NOR circuit which utilizes said burst signal and said CELL signal as inputs, and
    a set-reset flip-flop which utilizes an output from said NOR circuit as a set input, and which utilizes said CELL signal as a reset input.

4. A laser diode light emission sensing circuit for sensing a luminous state of the laser diode, comprises:
    a light sensor for sensing a lightwave signal of said laser diode to convert it into a current signal,
    a current/voltage converting device for converting a current signal from said light sensor into a voltage signal,
    a comparator for comparing a voltage signal from said current/voltage converting device with a reference voltage from a reference voltage producer to output a predetermined signal when the voltage signal from said current/voltage converting device exceeds said reference voltage from said reference voltage from said reference voltage producer,
    said reference voltage producer for outputting said reference voltage to said comparator,
    a first output inverter for inverting an output of a CELL signal rising before starting a light emission term wherein said laser diode repeats continually light emission and light outing, and falling from termination of said light emission term, and
    a delay flip-flop which utilizes an output of said comparator as a clock input, and which utilizes an output of said first output inverter as a reset input, and maintains a data input at a high level.

5. A laser diode light emission sensing circuit for sensing a luminous state of the laser diode, comprising:

a light sensor for sensing a lightwave signal of said laser diode to convert it into a current signal, a current/voltage converting device for converting a current signal from said light sensor into a voltage signal, a comparator, for comparing a voltage signal from said current/voltage converting device with a reference voltage from a reference voltage producer to output a predetermined signal when the voltage signal from said current/voltage converting device exceeds the reference voltage from said reference voltage producer, said reference voltage producer for outputting said reference voltage to said comparator, and a delay flip-flop which utilizes a CELL signal falling before starting a light emission term, wherein said laser diode repeats continually light emission and light outing, and rising from termination of said light emission term, as a reset input, and which utilizes an output of said comparator as a clock input, and maintains a data input at a high level.

6. A laser diode light emission sensing circuit for sensing a luminous state of the laser diode, comprising:

a light sensor for sensing a lightwave signal of said laser diode to convert into a current signal, a current/voltage converting device for converting a current signal from said light sensor into a voltage signal, a comparator for comparing a voltage signal from said current/voltage converting device with a reference voltage from reference voltage producer to output a predetermined signal when the voltage signal from said current/voltage converting device exceeds the reference voltage from said reference voltage producer, said reference voltage producer for outputting said reference voltage to said comparator, a second output inverter for inverting an output of a CELL signal rising before starting a light emission term wherein said laser diode repeats continually light emission and light outing, and falling from termination of said light emission term, a third output inverter for inverting an output of said predetermined signal from said comparator, an NOR circuit utilizing a signal from said second output inventer and a signal from said third output inverter as inputs to output a predetermined signal when both the signals are at a low level, and a set-reset flip-flop utilizing an output of said NOR circuit as a set input and utilizing a signal from said second output inverter as a reset input.

7. A laser diode light emission sensing circuit for sensing a luminous state of the laser diode, comprising:

a light sensor for sensing a lightwave signal of said laser diode to convert it into a current signal, a current/voltage converting device for converting a current signal from said light sensor into a voltage signal, a comparator for comparing a voltage signal from said current/voltage converting device with a reference voltage from a reference voltage producer to output a predetermined signal when the voltage signal from said current/voltage converting device exceeds the reference voltage from said reference voltage producer, said reference voltage producer for outputting said reference voltage to said comparator, a third output inverter for inverting an output of the predetermined signal from said comparator, an NOR circuit utilizing a CELL signal falling before starting a light emission term wherein said laser diode repeats continually light emission and light outing and rising from termination of said light emission term as well as a signal from said third output inverter as inputs to output a predetermined signal when both the signals are at a low level, and a set reset flip-flop utilizing an output of said NOR circuit as a set input and utilizing said CELL signal as a reset input.

8. A laser diode light emission sensing circuit for sensing a luminous state of the laser diode, comprising:

a burst signal producer for producing a burst signal which changes to a first state synchronously with a light emitting timing of said laser diode and which changes to a second state synchronously with a light outing timing of said laser diode; and a maintaining device which selectively causes a predetermined output state of the sensing circuit regardless of the state of the burst signal.

9. The laser diode light emission sensing circuit as claimed in claim 8, wherein:

when said maintaining device is in a logic low state, the output state of the sensing device is logic low; and when said maintaining device is in a logic high state, the output state of the sensing device is dependent upon the burst signal producer state.

10. The laser diode light emission sensing circuit as claimed in claim 8, wherein:

the predetermined state of the sensing circuit is a logic low state.

11. The laser diode light emission sensing circuit as claimed in claim 8, wherein the maintaining device has a predetermined low capacitance.

12. The laser diode light emission sensing circuit as claimed in claim 8, wherein the maintaining device digitally controls the output state of the sensing circuit.

* * * * *